(12) United States Patent
Dupuis

(10) Patent No.: US 7,522,892 B2
(45) Date of Patent: Apr. 21, 2009

(54) POWER AMPLIFIER WITH SERIAL INTERFACE AND ASSOCIATED METHODS

(75) Inventor: Timothy J. Dupuis, Austin, TX (US)

(73) Assignee: Black Sand Technologies, Inc., Austin, TX (US)

( * ) Notice: Subject to any disclaimer, the term of this patent is extended or adjusted under 35 U.S.C. 154(b) by 308 days.

(21) Appl. No.: 10/743,401

(22) Filed: Dec. 22, 2003

(65) Prior Publication Data

US 2005/0136866 A1   Jun. 23, 2005

(51) Int. Cl.
*H04B 1/04* (2006.01)
*H03G 3/20* (2006.01)

(52) U.S. Cl. .................. 455/127.1; 455/127.2; 455/126; 455/234.2; 330/129; 330/278; 330/289

(58) Field of Classification Search .............. 455/127.1, 455/127.2, 126, 114.3; 330/129, 278, 285; 326/37, 40, 56
See application file for complete search history.

(56) References Cited

U.S. PATENT DOCUMENTS

| | | | | |
|---|---|---|---|---|
| 4,360,787 A | * | 11/1982 | Galpin | ........................ 330/284 |
| 5,020,135 A | | 5/1991 | Kasparian et al. | |
| 5,101,173 A | | 3/1992 | DiPiazza et al. | |
| 5,159,283 A | * | 10/1992 | Jensen | ........................ 330/129 |
| 5,365,190 A | | 11/1994 | Yu et al. | |
| 5,473,279 A | * | 12/1995 | D'Angelo et al. | ............ 327/347 |
| 5,642,075 A | * | 6/1997 | Bell | ............................ 330/129 |
| 5,724,009 A | * | 3/1998 | Collins et al. | ........... 331/108 C |
| 5,886,658 A | * | 3/1999 | Amar et al. | ................. 341/155 |
| 6,307,429 B1 | | 10/2001 | Olgaard | |
| 6,400,416 B1 | * | 6/2002 | Tomasz | ...................... 348/654 |
| 6,462,620 B1 | | 10/2002 | Dupuis et al. | |
| 6,549,071 B1 | | 4/2003 | Paul et al. | |
| 6,605,999 B2 | | 8/2003 | Matsushita et al. | |
| 6,721,370 B1 | | 4/2004 | Kurihara | |
| 6,727,754 B2 | | 4/2004 | Dupuis et al. | |
| 6,756,849 B2 | | 6/2004 | Dupuis et al. | |
| 6,798,286 B2 | * | 9/2004 | Dauphinee et al. | .......... 330/129 |
| 6,828,859 B2 | | 12/2004 | Dupuis et al. | |
| 6,839,792 B2 | | 1/2005 | Feldstein et al. | |
| 6,847,904 B2 | * | 1/2005 | Blake et al. | .................... 702/57 |
| 6,891,430 B1 | * | 5/2005 | Thomsen et al. | ............ 327/560 |
| 6,894,266 B2 | * | 5/2005 | Richard et al. | ........... 250/214 R |
| 7,149,473 B1 | * | 12/2006 | Lindlar et al. | ............... 455/41.1 |
| 2002/0142741 A1 | * | 10/2002 | Molnar et al. | ................ 455/127 |
| 2002/0160734 A1 | | 10/2002 | Li et al. | |
| 2003/0040290 A1 | | 2/2003 | Sahlman et al. | |
| 2003/0152056 A1 | * | 8/2003 | Lee et al. | ..................... 370/338 |
| 2003/0155978 A1 | | 8/2003 | Pehlke | |
| 2003/0202622 A1 | | 10/2003 | Hajimiri et al. | |
| 2004/0038701 A1 | | 2/2004 | Lin | |

(Continued)

FOREIGN PATENT DOCUMENTS

WO    WO 01/84741    11/2001

Primary Examiner—Duc M Nguyen
(74) Attorney, Agent, or Firm—Johnson & Associates

(57) ABSTRACT

In a power amplifier, a serial bus interface is provided for sending and receiving information to other devices, such as a baseband controller. The power amplifier includes several control pins that can be used as a serial interface, or alternately, with a direct pin control interface. The power amplifier uses various techniques to address noise problems related to the use of a serial bus with a power amplifier.

41 Claims, 3 Drawing Sheets

U.S. PATENT DOCUMENTS

| | | |
|---|---|---|
| 2004/0097250 A1* | 5/2004 | Gunzelmann et al. ........ 455/502 |
| 2004/0148553 A1* | 7/2004 | Nalbantis .................... 714/726 |
| 2004/0162102 A1 | 8/2004 | Gronemeyer et al. |
| 2004/0166822 A1* | 8/2004 | Gronemeyer et al. .... 455/245.1 |
| 2004/0174218 A1 | 9/2004 | Dupuis et al. |
| 2005/0024145 A1 | 2/2005 | Bocock et al. |
| 2005/0068103 A1 | 3/2005 | Dupuis et al. |
| 2005/0218989 A1* | 10/2005 | Tsutsui et al. ............... 330/285 |

* cited by examiner

POWER AMPLIFIER WITH SERIAL INTERFACE AND ASSOCIATED METHODS

FIELD OF THE INVENTION

This invention relates to the field of power amplifiers. In particular, this invention is drawn to a power amplifier having a serial interface.

BACKGROUND OF THE INVENTION

Power amplifiers, such as the types of power amplifiers used in wireless communication systems, must be capable of operating at various power levels based on instructions from a controller. A typical prior art power amplifier uses individual pins to control the various functions of the power amplifier. A typical power amplifier may receive signals relating to what band the power amplifier is operating in, and a control signal to control when the power amplifier turns on. A power amplifier may also receive an analog automatic power control signal APC having a power level proportional to the desired output power level.

One problem with prior art power amplifiers is that the their functionality is limited. For example, limitations in the prior art prohibit some features, such as the ability to integrate new functions, or the ability for other devices to read the status of the power amplifier.

SUMMARY OF THE INVENTION

A power amplifier according to one illustrative embodiment of the invention includes a power amplifier formed on an integrated circuit and a serial interface for send and receiving signals.

Another illustrative embodiment of the invention provides a wireless communication device, such as a mobile or cellular telephone. The device includes a controller, a transceiver, and a power amplifier. A serial bus is connected to the controller, transceiver, and power amplifier to provide communication between the components.

Another illustrative embodiment of the invention provides a method of controlling a power amplifier. In this example, a baseband controller is connected to a digital bus. A power amplifier includes a serial interface which is connected to the digital bus.

Other features and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

In order to provide a context for understanding this description, the following description illustrates one example of a typical application of the present invention. A power amplifier having a serial interface of the present invention may be used for any desired applications, including a wireless transmission system such as mobile or cellular communication devices or other wireless devices. In a wireless device, the wireless device may include a transceiver, an antenna duplexer, and an antenna. Coupled between the transceiver and the antenna duplexer is an RF power amplifier for amplifying signals for transmission via the antenna. In the case of a wireless telephone application, the invention may be applied to GSM, CDMA, PCS, DCS, etc., or any other wireless systems. This is just one example of an application of a power amplifier utilizing the present invention. The invention may also be used in any other application requiring a power amplifier.

In general, the present invention provides a power amplifier with a serial interface for sending and receiving information to other devices in a system. The serial interface provides the power amplifier with increased flexibility, without using additional pins. As mentioned above, typical prior art power amplifiers are controlled using a few individual, dedicated pins.

Figure 1:
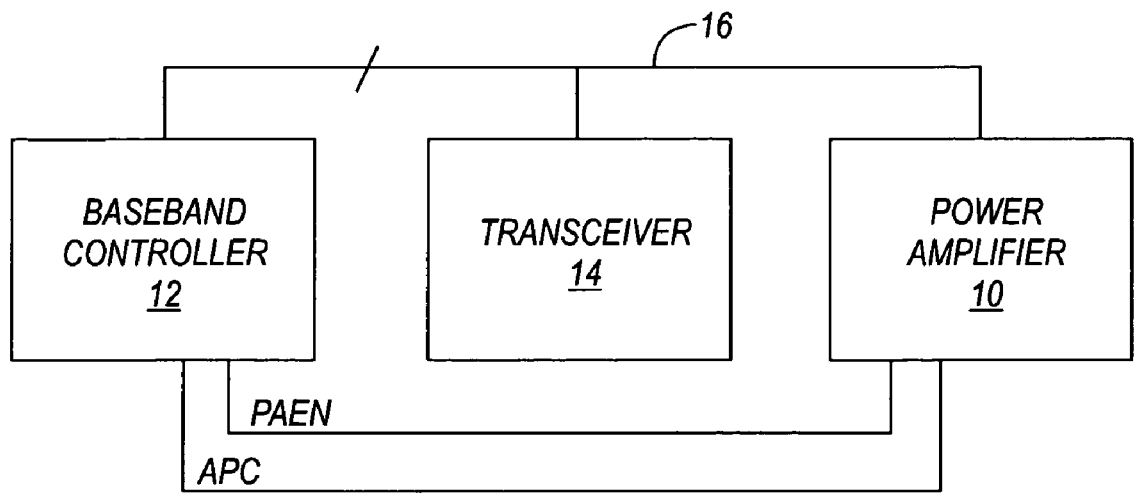
FIG. 1 is a block diagram of a wireless system including a power amplifier and a serial interface.

In contrast, with the present invention, the power amplifier is coupled to a serial interface to receive most of its instructions. FIG. 1 is a block diagram of a wireless system having a power amplifier 10, baseband controller 12, and transceiver 14. A serial interface 16 is coupled to the power amplifier 10, baseband controller 12, and transceiver 14. In one example, the serial bus used with the present invention is similar to an I²C type bus. The baseband controller 12 controls the operation of both the transceiver 14 and power amplifier 10 over the serial interface 16. In addition, the power amplifier 10 also receives PAEN and APC signals from the baseband controller 12. In one example, the power amplifier 10 is integrated in a CMOS chip, which allows many functions to be integrated within the power amplifier. One example of a power amplifier integrated in a CMOS chip is described in commonly-owned U.S. Pat. No. 6,549,071, issued on Apr. 15, 2003, entitled "POWER AMPLIFIER CIRCUITRY AND METHOD USING AN INDUCTANCE COUPLED TO POWER AMPLIFIER SWITCHING DEVICES," which is expressly incorporated by reference herein. For example, the power amplifier can include temperature sensors, digital thermometers, battery sensors, and load conditioning sensing. These functions may use multiple bits of data, which can be communicated with the baseband controller 12 via the serial interface 16.

The power amplifier serial interface provides several advantages over the prior art. First, the serial interface allows many bits to be communicated without using additional pins. Also, the power amplifier can share an existing bus in the system (like in the example shown in FIG. 1), or use a separate bus. If a bus is shared, a controller can provide a single instruction that can be received by the power amplifier, as well as other systems or components coupled to the bus. For example, if the controller sends a mode command to the transceiver, the power amplifier can "snoop" or monitor the bus to automatically determine which mode it should be in. The serial interface can also enable additional features, such as digital power control. In addition to a serial bus, other types of interfaces can also be used. For example, a parallel interface could be used with the power amplifier of the present invention, although more pins would be used.

Figure 2:
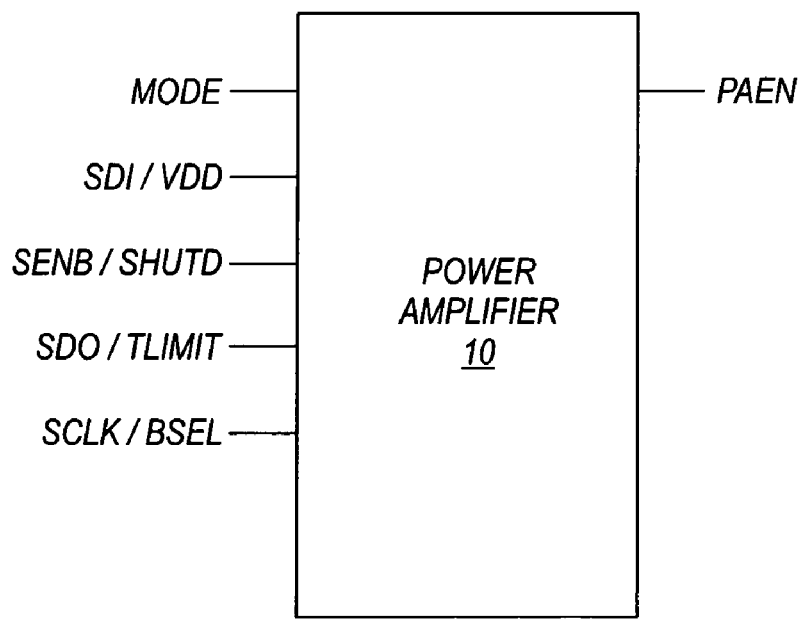
FIG. 2 is a diagram of a power amplifier formed on an integrated circuit.

The power amplifier of the present invention is backwards compatible with systems that do not have a serial bus to communicate with the power amplifier. The power amplifier can operate in either a direct "pin mode" or in the "serial interface mode" when using the serial bus. Another advantage of the present invention is that some of the same pins function during the pin mode or the serial interface mode. FIG. 2 is a diagram of a power amplifier 10 formed on an integrated circuit, showing several of its pins. The MODE pin is used to select the pin mode or the serial interface mode. The PAEN (power amplifier enable) pin is used to communicate to the power amplifier 10 when to turn on. The remaining pins shown in FIG. 2 designate two functions depending on which mode is selected (i.e., serial mode/pin mode).

In pin mode, a standard pin interface is provided to allow programming of the power amplifier 10. A first input pin, BSEL (band select) is used to communicate to the power amplifier which band is being used (e.g., GSM or DCS). A second input pin, VDD is a reference voltage for the digital I/O and allows a user to set the digital I/O levels to be compatible with the baseband I/O levels. A first output pin, TLIMIT (thermal limit signal) triggers if the die temperature exceeds a predefined temperature limit. A second output pin, SHUTD (shutdown) triggers when the thermal limit threshold is crossed. The power amplifier will automatically shut down on the rising edge of SHUTD to protect the power amplifier from damage.

In serial interface mode, a serial port is employed to allow programming of the power amplifier 10. If desired, the serial port can be shared with other devices (e.g., a transceiver, etc.) in addition to the baseband controller. The serial port allows access to certain features and internal registers that are not available in the pin control mode. A first input pin, SCLK (serial clock) receives the serial clock signal. A second input pin, SENB (serial enable) controls when the serial port is enabled. A third input pin, SDI (serial data out) is the serial data input pin. An output pin, SDO (serial data out) is the serial data output pin.

One example of a feature that is enabled by the serial interface relates to thermal protection. In serial interface mode, a user may access programmable registers associated with thermal protection. If the die temperature exceeds a predetermined temperature setting, the baseband controller is alerted via the TLIMIT pin. If the die temperature exceeds a predetermined temperature, the power amplifier is automatically powered down to prevent device damage. These conditions may be detected by the baseband controller by monitoring the serial bus.

There are several design issues that should be considered in implementing a serial bus in an RF power amplifier. For example, bus noise can cause spurs in the RFO frequency spectrum. Another issue is that during an RF burst, large voltages and currents at the RF carrier frequency can be induced in the serial bus lines causing loss and potential problems in logic circuits in the transceiver and baseband controller. Another issue is that high speed I/O's have electrostatic discharge (ESD) issues. Another issue relates to the number of pins needed to implement the serial interface. The following discusses design considerations relating to those issues.

As mentioned above, bus noise can cause spurs in the power amplifier output RFO frequency spectrum. The present invention disables the serial bus during RF bursts. With the serial bus used with the present invention, the serial clock (SCLK) operates when data is being transferred, which happens between bursts.

Figure 3:
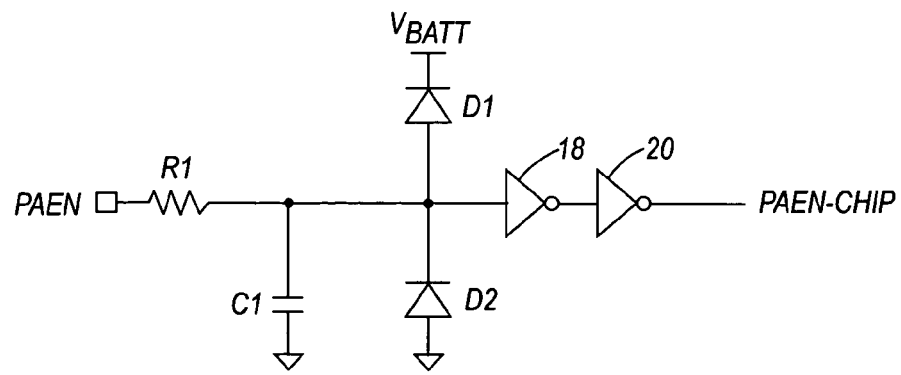
FIG. 3 is a schematic diagram illustrating the filter used on control signal pins.

To address large voltages and currents induced at the RF carrier frequency during the RF burst, the present invention uses several approaches. For slower control signals (e.g., PAEN) a filtering circuit is used. FIG. 3 is a schematic diagram illustrating the filter used on slower control signal pins. In FIG. 3, signals sent to the PAEN pin are filtered by a low pass RC filter comprised of resistor R1 and capacitor C1. The filtered signal is connected between $V_{BATT}$ and ground via diodes D1 and D2. The filtered signal is then inverted twice by inverters 18 and 20 to provide the internal power amplifier enable signal PAEN-CHIP. The signal PAEN is the signal that enables the power amplifier and is active during the entire burst. This signal is not used to communicate high speed digital data, so the low pass filter can be used to remove the RF pickup.

Figure 4:
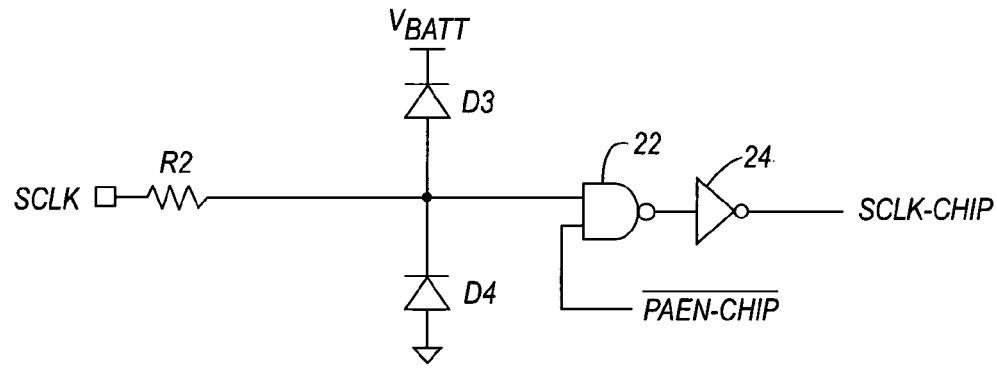
FIG. 4 is a schematic illustrating a blocking gate circuit.

For the faster signals (e.g., SCLK, SENB, SDI), the present invention uses a blocking gate that is enabled during the RF burst. FIG. 4 is a schematic illustrating a blocking gate circuit. FIG. 4 shows the non-filtered gate block circuit that is used with the serial clock SCLK signal. As shown, the SCLK signal passes through resistor R2, and is coupled between $V_{BATT}$ and ground via diodes D3 and D4. The signal is then provided as a first input to NAND gate 22. A second input of NAND gate 22 is coupled to the inverted power amplifier enable signal $\overline{\text{PAEN-CHIP}}$, which is low during a burst. The output of the NAND gate 22 is inverted by inverter 24, to provide the internal serial clock signal SCLK-CHIP. During a burst, the signal SCLK-CHIP will always be high, essentially disconnecting the input signal SCLK. This same technique is used on other high speed bus input signals SENB and SDI, preventing logic glitches and power supply current.

Figure 5:
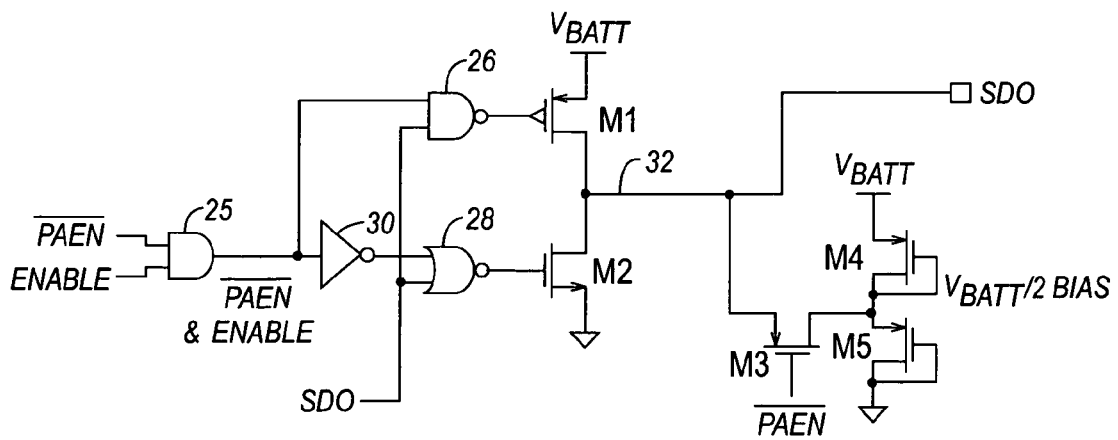
FIG. 5 is a schematic diagram illustrating how the serial digital output pin is driven.

During a burst, the serial data output pin is dealt with differently. The output is not filtered in the same way described above because of the amount of current that is driven. Instead, a driver is provided to drive either a "1" or a "0". FIG. 5 is a schematic diagram illustrating how the serial digital output pin is driven. Generally, a tri-state driver is provided so that, when an output signal is being driven between bursts, the driver drives a "1" or a "0." During a burst, and when a read-back is not occurring, the pin is tri-stated and a bias signal is applied to it.

As shown in FIG. 5, the inverted power amplifier enable signal $\overline{\text{PAEN}}$ and the bus enable (ENABLE) signal are provided as inputs to AND gate 25. The output of AND gate 25 ($\overline{\text{PAEN}}$ & ENABLE) is coupled to an input of NAND gate 26, and to an input of NOR gate 28, after being inverted by inverter 30. During a burst, when $\overline{\text{PAEN}}$ is low and ENABLE is high, the outputs of NAND gate 26 and NOR gate 28 will be "1" and "0," respectively, regardless of the signal at SDO. As a result, switching devices M1 and M2 will both be off during a burst, making node 32 (which is also SDO) tri-stated. FIG. 5 also shows a low current bias circuit, comprised of switching devices M3, M4, and M5, which is connected to node 32 during a burst.

The bias circuit biases the node 32 to $V_{DD}/2$ during the burst. As a result, the RF voltage pickup signal will appear across the tri-state devices and will not turn on the parasitic diodes to ground and $V_{BATT}$, which reduces loss and reduces the RF voltage present on the digital line. In other words, during bursts, a goal is to keep diodes turned off while maximizing the impedance seen looking into the output pin SDO. Between bursts, when $\overline{\text{PAEN}}$ is high and the driver is enabled, the outputs of NAND gate 26 and NOR gate 28 will both be the inversion of SDO, which makes node 32 (or SDO at the output of the chip) equal to the value of SDO. Also, when PAEN is high, switching device M3 will be off so the bias circuit will not be applied to node 32. It is desirable when designing the power amplifier integrated circuit to choose the output pin SDO to be the pin on the package to be the pin with reduced pickup.

As mentioned above, the high speed I/O's have ESD issues. To help reduce the RF current in the I/O loops, a series resistor (e.g., resistor R2 in FIG. 4) is used, and the capacitance at the inputs is reduced. However, the use of the series resistors can cause low ESD performance since a discharge can cause high current in the resistor, resulting in thermal damage. There is a trade-off when choosing the size of the resistor since a larger area resistor will have better ESD performance, but will have a higher capacitance. One suitable example for the series resistor is a 3 kohm poly resistor, which will have a relatively good RF performance and will meet 200 V ESD.

It is desirable that the serial interface of the present invention have as few pins as possible due to the RF issues described above. In addition, it is desirable that the serial port interface also work in pin mode to be backwards compatible with existing power amplifiers. In addition, the digital interface levels are different (lower) than the battery voltage. As a result, a reference VDD is supplied, and level shifters are used at the inputs and outputs.

As described above with respect to FIG. 2, four of the power amplifier pins function under either the pin mode or the serial interface mode. As described above, in the serial interface mode (when the MODE pin is high), the pins define a serial interface using pins SDI, SDO, SENB, and SCLK. When MODE is high, the MODE pin is used as the $V_{DD}$ for the input and output level shifters (described below). In the pin control mode (MODE is low), the pins are defined as a pin control using pins BSEL, TLIMIT, and SHUTD. In this case, the SDI/$V_{DD}$ pin should be connected to $V_{DD}$ which provides the supply for the input/output level shifters.

Figure 6:
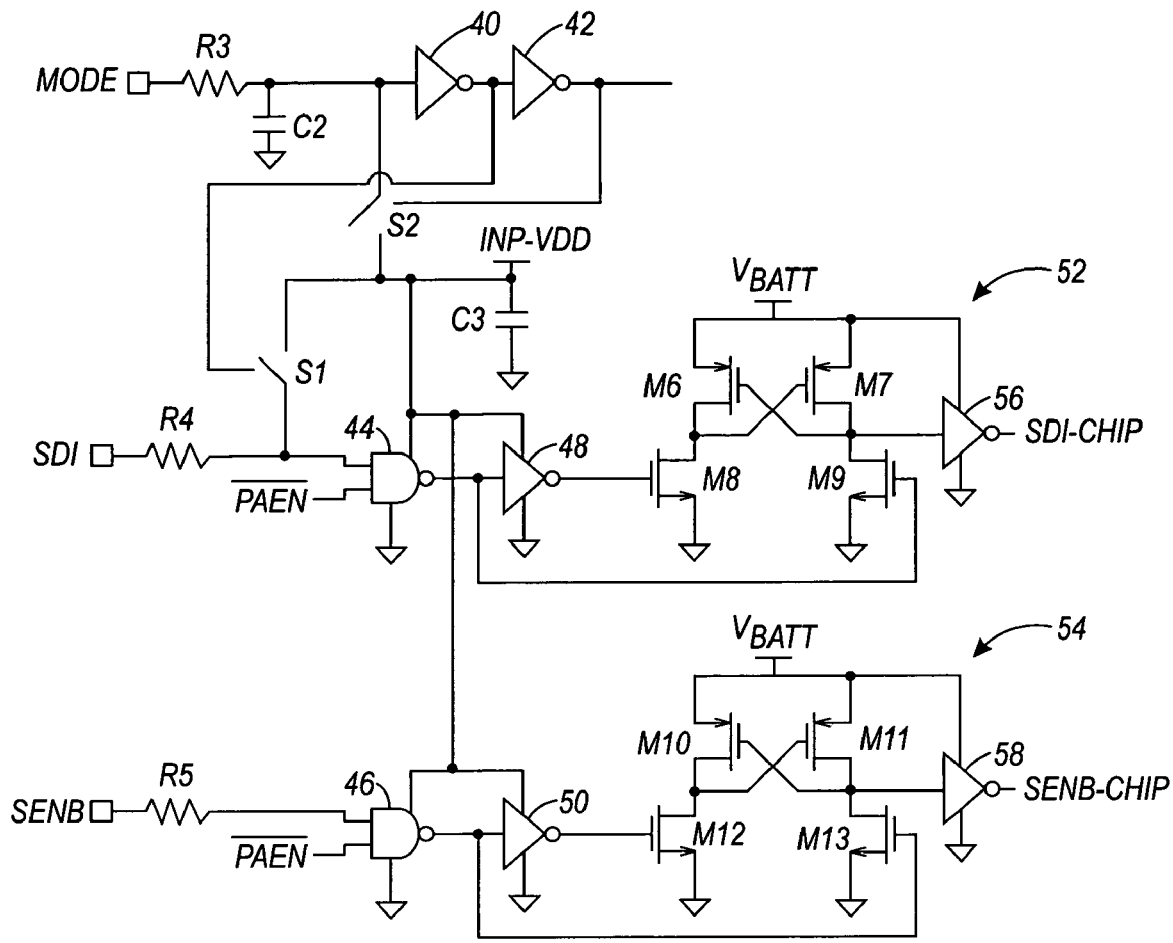
FIG. 6 is a schematic diagram of three of the power amplifier pins illustrating how the reference VDD is supplied.

FIG. 6 is a schematic diagram of three of the power amplifier pins illustrating how the number of pins are minimized, and how the reference $V_{DD}$ is supplied. First, looking at the MODE pin, filter circuitry (resistor R3 and capacitor C2) is provided similar to that shown in FIG. 3. When MODE is high (serial interface mode), then the filtered signal is inverted twice by inverters 40 and 42. The outputs of inverters 40 and 42 each control a switch S1 and S2, respectively.

In serial interface mode, switch S1 will be open and switch S2 closed, which causes the voltage at pin MODE to become the internal reference power supply (INP-VDD). As shown, INP-VDD supplies NAND gates 44 and 46, as well as inverters 48 and 50. Since the MODE signal comes from the baseband controller, the internal reference power supply will be compatible with the baseband controller voltage levels. Pins SDI and SENB include circuits similar to the circuit shown in FIG. 4. The signals pass through resistors R4 and R5, and then through the NAND gates 44 and 46, between bursts. During bursts, the outputs of the NAND gates 44 and 46 will be constant, regardless of the signals at the SDI and SENB pins. FIG. 6 also shows level shifters 52 and 54 which shift the signal level to the $V_{BATT}$ level. The level shifters are comprised of switching devices M6 through M13 and inverters 56 and 58. In pin mode, switch S1 will be closed and switch S2 will be open. In pin mode, the internal voltage supply INP-VDD will no longer be equal to the voltage on the MODE pin.

Figure 7:
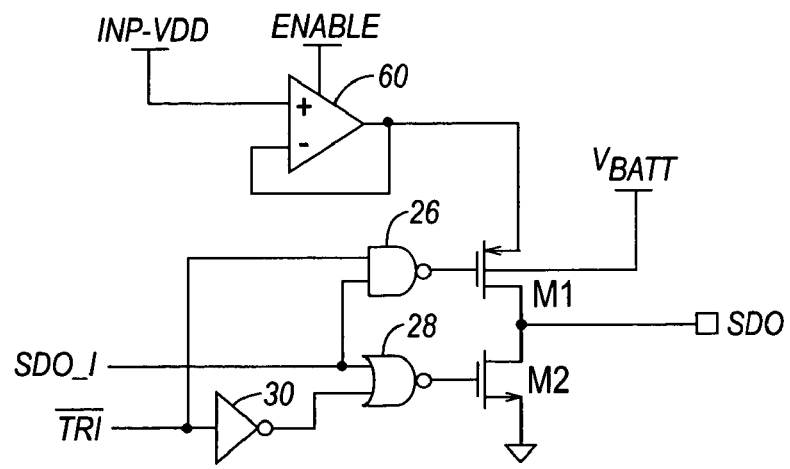
FIG. 7 is a schematic diagram of the buffer amplifier used for driving the SDO output signal.

Another feature of the present invention relates to how the serial output signal at SDO is driven. Since the signal on the SDO pin is provided to the baseband chip, it is desirable for the voltage level to be compatible with the level at the baseband chip. However, it may be impractical to pull much current from INP-VDD, which is provided by the MODE pin. To solve this problem, a buffer amplifier is used when transmitting a signal over the serial bus. FIG. 7 is a schematic diagram of the buffer amplifier used for driving the SDO output signal. FIG. 7 is similar to what is shown in FIG. 5, with the addition of op-amp 60, which buffers INP-VDD to provide the drive. The buffer circuitry allows more current to be drawn from the battery, rather than from INP-VDD. Since the op-amp 60 consumes power when enabled, it is enabled when the user requests a read-back through the serial interface. When the user is not requesting a read back, SDO is tri-stated.

In the preceding detailed description, the invention is described with reference to specific exemplary embodiments thereof. Various modifications and changes may be made thereto without departing from the broader spirit and scope of the invention as set forth in the claims. The specification and drawings are, accordingly, to be regarded in an illustrative rather than a restrictive sense.

What is claimed is:

1. An RF power amplifier formed using an integrated circuit having a plurality of interface pins, comprising:
    a power amplifier circuit;
    a mode selection pin for selecting a fist mode or a second mode of operation, wherein the first mode of operation is a serial interface mode and the second mode of operation is a non-serial interface mode;
    a first interface pin, wherein the first interface pin has a first function in the first mode of operation and a second function in the second mode of operation; and
    a serial interface formed using the integrated circuit for sending and receiving signals.

2. The RF power amplifier of claim 1, further comprising a second interface pin, wherein the second interface pin has a first function in the first mode of operation and a second function in the second mode of operation.

3. The RF power amplifier of claim 1, wherein the first mode is a serial interface mode and the second mode is a pin control mode.

4. The RF power amplifier of claim 1, wherein the mode selection pin is used as an internal voltage source in the power amplifier.

5. The RF power amplifier of claim 4, wherein the mode selection pin is used as an internal voltage source in the power amplifier only when the first mode is selected.

6. The RF power amplifier of claim 1, wherein the RF power amplifier further comprises:
    a plurality of pins for coupling to a serial bus; and
    a low pass filter coupled to one of the pins for filtering control signals to reduce RF noise.

7. The RF power amplifier of claim 1, wherein the RF power amplifier further comprises:
    a plurality of pins for coupling to a serial bus; and
    a gate circuit coupled to a first pin for selectively blocking the signal received at the first pin.

8. The RF power amplifier of claim 7, wherein the signal is blocked when the RF power amplifier is enabled.

9. The RF power amplifier of claim 7, wherein the first pin receives a serial clock signal.

10. The RF power amplifier of claim 1, wherein the RF power amplifier further comprises:
    a serial data output pin for coupling to a serial bus; and
    a tri-state driver coupled to the serial data output pin.

11. The RF power amplifier of claim 10, wherein the tri-state driver tri-states the output pin while the RF power amplifier is transmitting.

12. The RF power amplifier of claim 11, further comprising a bias circuit for biasing the tri-stated output pin while the RF power amplifier is transmitting.

13. A wireless communication device comprising:
- a controller circuit adapted to control the operation of the communication device;
- a transceiver;
- an RF power amplifier having a mode control pin and a plurality of interface pins, wherein the state of the mode control pin determines whether the RF power amplifier operates using a serial interface mode or a non-serial interface mode, and wherein the plurality of interface pins provide a serial interface with the controller circuit in the serial interface mode and the plurality of interface pins provide a non-serial interface with the controller circuit in the non-serial interface mode; and
- a serial bus coupled to the controller, transceiver, and RF power amplifier.

14. The wireless communication device of claim 13, wherein the power amplifier includes a sensor for sensing a property of the power amplifier.

15. The wireless communication device of claim 14, wherein information from the sensor is transmitted to the controller over the serial bus.

16. The wireless communication device of claim 15, wherein the sensor is a temperature sensor.

17. The wireless communication device of claim 13, wherein the controller transmits a band control signal to the transceiver over the serial bus, and wherein the power amplifier monitors the serial bus and automatically selects a band based on the band control signal.

18. The wireless communication device of claim 13, wherein the serial bus is disabled when the power amplifier is enabled.

19. The wireless communication device of claim 13, further comprising a coupling between the controller and the mode control pin, wherein the controller supplies the power amplifier with a voltage supply via the connection to the mode control pin.

20. The wireless communication device of claim 13, wherein the serial bus is disabled when the power amplifier is transmitting.

21. The wireless communication device of claim 13, wherein the power amplifier further comprises:
- a plurality of pins for coupling to a serial bus; and
- a low pass filter coupled to one of the pins for filtering control signals to reduce RF noise.

22. The wireless communication device of claim 13, wherein the power amplifier further comprises:
- a plurality of pins for coupling to a serial bus; and
- a gate circuit coupled to a first pin for selectively blocking the signal received at the pin.

23. The wireless communication device of claim 22, wherein the signal is blocked when the power amplifier is enabled.

24. The wireless communication device of claim 23, wherein the first pin receives a serial clock signal.

25. The wireless communication device of claim 13, wherein the power amplifier further comprises:
- a serial data output pin for coupling to a serial bus; and
- a tri-state driver coupled to the serial data output pin.

26. The wireless communication device of claim 25, wherein the tri-state driver tri-states the output pin while the power amplifier is transmitting.

27. The wireless communication device of claim 26, further comprising a bias circuit for biasing the tri-stated output pin while the power amplifier is transmitting.

28. A method of controlling an RF power amplifier in a wireless communications device, comprising:
- providing a baseband controller coupled to a digital bus;
- providing an RF power amplifier having a serial interface for communicating with the digital bus and having a mode control pin;
- applying a control signal to the mode control pin to select between a first mode of operation and a second mode of operation, wherein the first ode of operation is a serial interface mode and the second mode of operation is a non-serial interface mode;
- providing a first interface pin, wherein the first interface pin has a first function in the first mode of operation and a second function in the second mode of operation; and
- coupling the serial interface of the RF power amplifier to the digital bus.

29. The method of claim 28, wherein the power amplifier transmits signals in periodic bursts, and wherein the digital bus is disabled during the bursts.

30. The method of claim 28, wherein the serial interface of the power amplifier uses a plurality of pins, the method further comprising the step of coupling a low pass filter to at least one of the pins.

31. The method of claim 28, wherein the serial interface of the power amplifier uses a plurality of pins, the method further comprising the step of blocking the signal provided to a first pin of the power amplifier serial interface when the power amplifier is transmitting.

32. The method of claim 28, further comprising providing a serial data output pin at the serial interface of the power amplifier; and when the power amplifier is transmitting, biasing the serial data output pin.

33. The method of claim 28, further comprising providing a serial data output pin at the serial interface of the power amplifier; and when the power amplifier is transmitting, tri-stating the serial data output pin.

34. The method of claim 33, further comprising biasing the tri-stated output pin.

35. The method of claim 28, further comprising sensing a condition in the power amplifier; and sending information relating to the sensed condition over the digital bus.

36. The method of claim 35, wherein the sensed condition is temperature.

37. The method of claim 35, further comprising shutting down the RF power amplifier in response to the sensed condition.

38. The method of claim 37, the RF power amplifier is shut down when a threshold temperature is sensed.

39. The method of claim 28, further comprising providing a second interface pin, wherein the second interface pin has a first function in the first mode of operation and a second function in the second mode of operation.

40. The method of claim 28, wherein the first mode of operation is a serial interface mode and the second mode of operation is a pin control mode.

41. The method of claim 28, wherein the baseband controller transmits a band control signal to the RF power amplifier over the digital bus, and wherein the RF power amplifier monitors the digital bus and automatically selects a band based on the band control signal.

* * * * *